United States Patent
Straw et al.

(10) Patent No.: US 9,263,235 B2
(45) Date of Patent: Feb. 16, 2016

(54) METHOD FOR COINCIDENT ALIGNMENT OF A LASER BEAM AND A CHARGED PARTICLE BEAM

(71) Applicants: Marcus Straw, Portland, OR (US); Mark Emerson, Pullman, WA (US)

(72) Inventors: Marcus Straw, Portland, OR (US); Mark Emerson, Pullman, WA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/303,227

(22) Filed: Jun. 12, 2014

(65) Prior Publication Data

US 2015/0060660 A1  Mar. 5, 2015

Related U.S. Application Data

(63) Continuation of application No. 13/607,329, filed on Sep. 7, 2012, now Pat. No. 8,766,213.

(51) Int. Cl.
| | |
|---|---|
| *H01J 37/00* | (2006.01) |
| *H01J 37/304* | (2006.01) |
| *H01J 37/22* | (2006.01) |
| *H01J 37/305* | (2006.01) |
| *G21K 5/00* | (2006.01) |
| *G21K 5/08* | (2006.01) |

(52) U.S. Cl.
CPC ............... *H01J 37/3045* (2013.01); *G21K 5/00* (2013.01); *G21K 5/08* (2013.01); *H01J 37/226* (2013.01); *H01J 37/228* (2013.01); *H01J 37/3056* (2013.01); *H01J 2237/1501* (2013.01); *H01J 2237/28* (2013.01)

(58) Field of Classification Search
USPC ........................ 250/491.1, 492.1, 492.2, 492.3
See application file for complete search history.

(56) References Cited

U.S. PATENT DOCUMENTS

| | | | |
|---|---|---|---|
| 7,880,151 B2 | 2/2011 | Wells | |
| 8,168,961 B2 | 5/2012 | Straw et al. | |
| 8,314,410 B2 | 11/2012 | Straw et al. | |
| 8,618,478 B2 | 12/2013 | Smit et al. | |
| 8,766,213 B2 * | 7/2014 | Straw et al. | ................. 250/492.2 |
| 2003/0222221 A1 | 12/2003 | Groholskiy et al. | |
| 2009/0008578 A1* | 1/2009 | Tomimatsu et al. | ...... 250/492.21 |
| 2011/0031655 A1 | 2/2011 | Toth et al. | |
| 2011/0115129 A1 | 5/2011 | Straw et al. | |
| 2011/0163068 A1 | 7/2011 | Utlaut et al. | |
| 2011/0198326 A1 | 8/2011 | Doemer | |
| 2012/0103945 A1 | 5/2012 | Straw et al. | |
| 2012/0200007 A1 | 8/2012 | Straw et al. | |

OTHER PUBLICATIONS

Kral, L., "Automatic beam alignment system for a pulsed infrared laser", Review of Scientific Instruments, American Institute of Physics, 2009, pp. 013102-1 to 013102-5, vol. 80.

Majumdar, J. Dutta, et al., "Laser processing of materials", Metallurgical and Materials Engineering Department, Indian Institute of Technology, Sadhana, Jun./Aug. 2003, pp. 495-562, vol. 28.

* cited by examiner

*Primary Examiner* — Nicole Ippolito
*Assistant Examiner* — Hanway Chang
(74) *Attorney, Agent, or Firm* — Scheinberg & Associates, PC; Michael O. Scheinberg; Nathan H. Calvert

(57) ABSTRACT

A method and apparatus for aligning a laser beam coincident with a charged particle beam. The invention described provides a method for aligning the laser beam through the center of an objective lens and ultimately targeting the eucentric point of a multi-beam system. The apparatus takes advantage of components of the laser beam alignment system being positioned within and outside of the vacuum chamber of the charged particle system.

19 Claims, 4 Drawing Sheets

METHOD FOR COINCIDENT ALIGNMENT OF A LASER BEAM AND A CHARGED PARTICLE BEAM

This application is a Continuation of U.S. patent application Ser. No. 13/607,329, filed Sep. 7, 2012, which is hereby incorporated by reference.

TECHNICAL FIELD OF THE INVENTION

The present invention relates to charged particle beam systems, more specifically to a system and method for laser beam alignment within charged particle beam systems.

BACKGROUND OF THE INVENTION

Charged particle beam systems are used in a variety of applications, including the manufacturing, repair, and inspection of miniature devices, such as integrated circuits, magnetic recording heads, and photolithography masks. Charged particle beams include ion beams and electron beams.

Ions in a focused beam typically have sufficient momentum to micromachine by physically ejecting material from a surface. Because electrons are much lighter than ions, electron beams are typically limited to removing material by inducing a chemical reaction between an etchant vapor and the substrate. Both ion beams and electron beams can be used to image a surface at a greater magnification and higher resolution than can be achieved by the best optical microscopes.

Since ion beams tend to damage sample surfaces even when used to image, ion beam columns are often combined with electron beam columns in dual beam systems. Such systems often include a scanning electron microscope (SEM) that can provide a high-resolution image with minimal damage to the target, and an ion beam system, such as a focused or shaped beam system, that can be used to alter workpieces and to form images. Dual beam systems including a liquid metal focused ion beam and an electron beam are well known.

Focused ion beam milling in many instances are unacceptably slow for some micromachining applications. Other techniques, such as milling with a femtosecond laser can be used for faster material removal but the resolution of these techniques is lower than a typical LMIS FIB system. Lasers are typically capable of supplying energy to a substrate at a much higher rate than charged particle beams, and so lasers typically have much higher material removal rates (typically up to $7 \times 10^6$ µm$^3$/s for a 1 kHz laser pulse repetition rate) than charged particle beams (typically 0.1 to 3.0 µm$^3$/s for a Gallium FIB). Laser systems use several different mechanisms for micromachining, including laser ablation, in which energy supplied rapidly to a small volume causes atoms to be explosively expelled from the substrate. All such methods for rapid removal of material from a substrate using a laser beam will be collectively referred to herein as laser beam milling.

The combination of a charged particle beam system with a laser beam system can demonstrate the advantages of both. For example, combining a high resolution LMIS FIB with a femtosecond laser allows the laser beam to be used for rapid material removal and the ion beam to be used for high precision micromachining in order to provide an extended range of milling applications within the same system. The combination of an electron beam system, either alone or in conjunction with a FIB, allows for nondestructive imaging of a sample.

FIG. 1 shows a prior art dual beam system 100 having a combination charged particle beam column 101 and laser 104. Such a dual beam system is described in U.S. Pat. App. No. 2011/0248164 by Marcus Straw et al., for "Combination Laser and Charged Particle Beam System," which is assigned to the assignee of the present application, and which is hereby incorporated by reference. U.S. Pat. App. No. 2011/0248164 is not admitted to be prior art by its inclusion in this Background section. As shown in the schematic drawing of FIG. 1, the laser beam 102 from laser 104 is focused by lens 106 located inside the vacuum chamber 108 into a converging laser beam 120. The laser beam 102 enters the chamber through a window 110. A single lens 106 or group of lenses (not shown) located adjacent to the charged particle beam 112 is used to focus the laser beam 120 such that it is either coincident and confocal with, or adjacent to, the charged particle beam 112 (produced by charged particle beam focusing column 101) as it impacts the sample 114 at location 116.

Integrating a laser beam system with a charged particle beam system provides significant challenges. Problems may arise in spatially stabilizing the laser beam that is used in conjunction with a charged particle beam. The stability of the laser is determined by its ability to precisely maintain its direction as well as its initial position with the output aperture. The laser beam position may drift, however, over time with variations in temperature, mechanical vibrations inside the laser, and other environmental conditions. Periodic realignment of the laser beam is therefore required to compensate for the drift. Aligning a laser beam within a charged particle beam system is currently a very tedious and time consuming manual process and requires significant expertise. Automated beam positioning in laser beam systems is well known. See "Automatic beam alignment system for a pulsed infrared laser", Review of Scientific Instruments 80, 013102 (2009). Past systems usually use a controller that receives signals from beam position detectors, and consequently issue commands for motorized optical elements (e.g., adjustable mirrors) in order to maintain proper alignment of the beam.

Unfortunately, other than aligning the laser beam manually, there is currently no practical system that allows for the convenient alignment of the laser beam positioning in charge particle beam systems. The small sample chamber of a charged particle beam system makes it difficult to house components needed for beam alignment systems. What is needed is a method and apparatus for a convenient way to align a laser beam within a charged particle beam system without the need for performing the alignment manually.

SUMMARY OF THE INVENTION

An object of the invention is to provide a method and apparatus to perform an alignment of a laser beam within a charged particle beam system that is done in conjunction with an electron beam or focused ion beam that provides coincident alignment with the system's eucentric point. According to a preferred embodiment of the present invention, a beam positioning system may be used to provide this type of alignment.

Another object of the invention is to provide a system having a vacuum chamber, a workpiece support within the vacuum chamber, a charged particle beam system for generating a beam of charged particles, a laser beam system for generating a laser beam, and a laser beam alignment system for aligning the laser beam, wherein the laser beam alignment system has a laser beam position detector in the vacuum chamber. The system will have a second beam position detector outside the vacuum chamber and beam steering mirrors to make adjustments to the laser beam so that the laser beam is aligned to the eucentric point of a charged particle beam system.

Another object of the invention is to provide a method of making adjustments to a laser beam comprising a charged particle beam source capable of generating a charged particle beam, providing a vacuum chamber, providing a laser beam source capable of generating a laser beam, providing a laser beam alignment system that allows the laser beam source to be aligned to the eucentric point of a charged particle beam system.

Another object of the invention is to provide a method of using a laser system with a charge particle beam system, wherein the steps include generating a charged particle beam to be used on a workpiece, generating a laser beam to be used on the workpiece, wherein the laser beam is aligned eucentrically to the workpiece. The aligning process of the laser beam is performed using an alignment detector that is located within the vacuum chamber of the system, as well as an alignment detector that is located outside the detector.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

The incorporation of a laser beam system with a charged particle system involves difficulties with the amount of time and expertise required to align the laser beam. The common methods for aligning a laser beam inside a vacuum chamber are very tedious and time consuming manual processes. Embodiments of the present invention provide advantages over common methods of manually aligning a laser beam within a charged particle beam system. Some embodiments of the present invention provide a system for the alignment of a laser beam within a charged particle beam system using laser position sensors.

Figure 1:
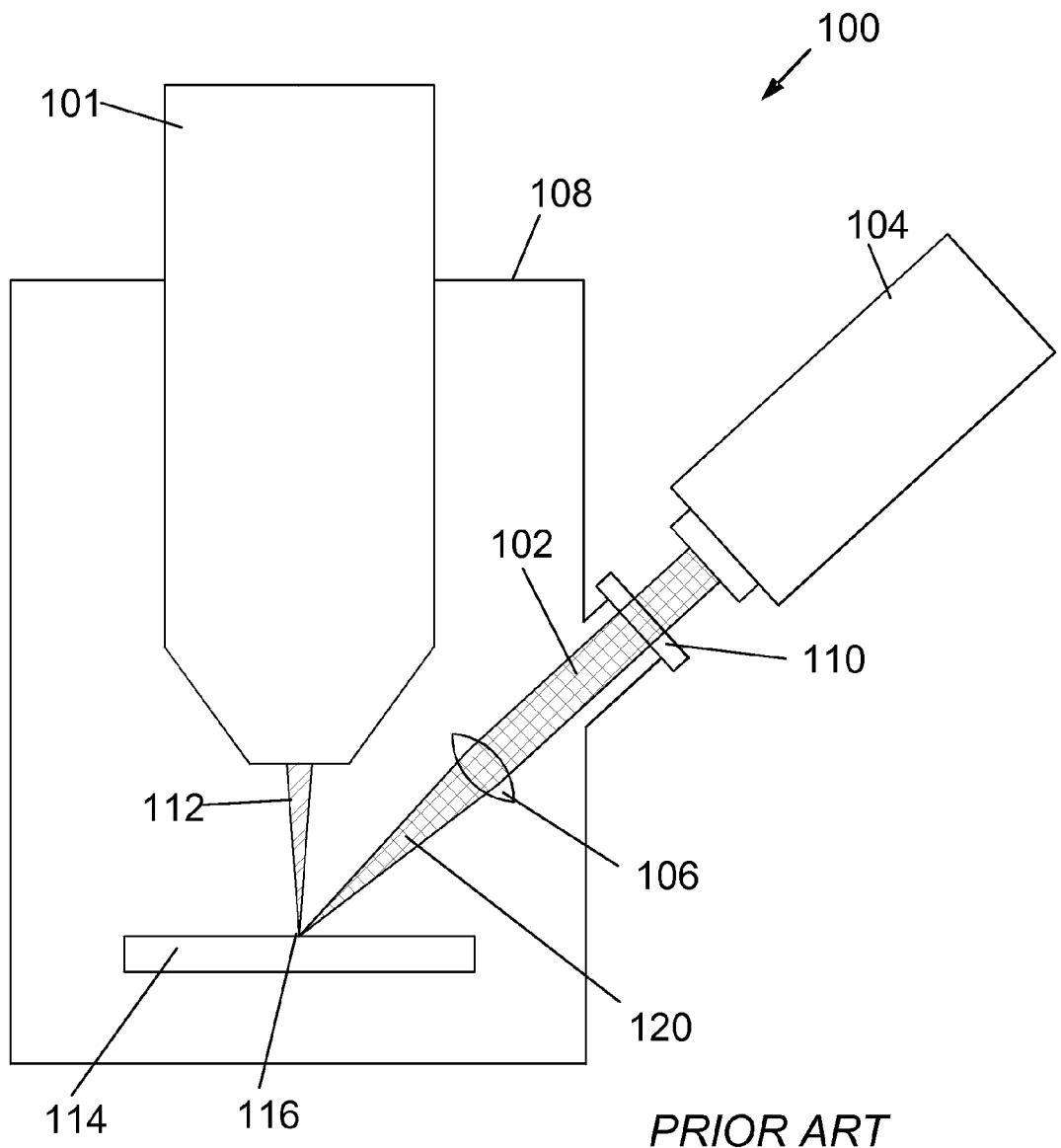
FIG. 1 shows a schematic view of a prior art dual-beam system including charged particle beam and laser beam subsystems.
Figure 2:
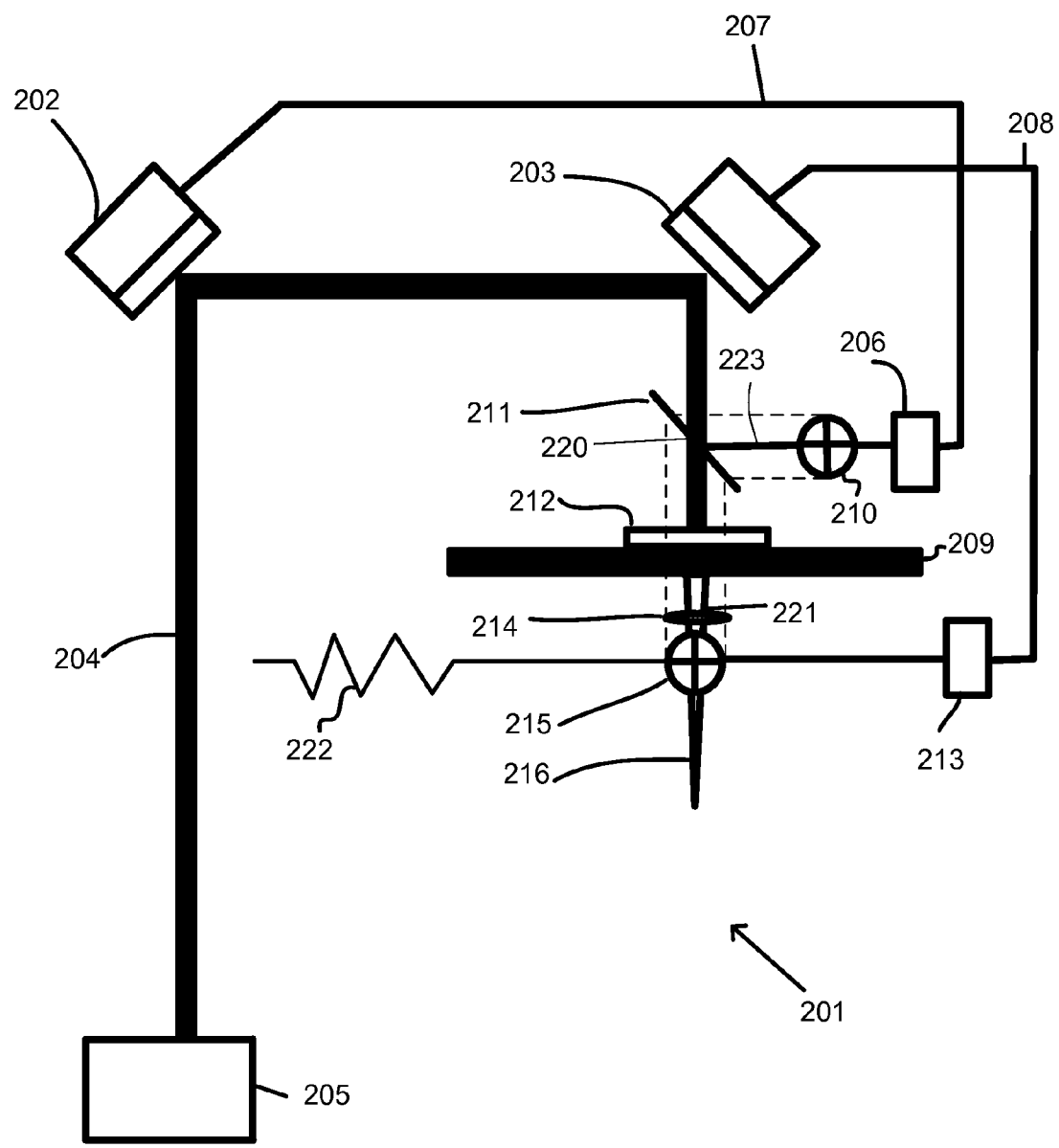
FIG. 2 shows a schematic view of an embodiment of the invention showing a laser beam alignment system.

FIG. 2 shows a schematic view of a laser beam alignment system 201 according to a preferred embodiment that is used in charged particle beam system. A laser beam source 205 generates a laser beam 204. Two fast steering mirrors 202, 203 are positioned to control the direction of the laser beam 204. Fast steering mirrors (FSM) have the ability to mechanically tilt the mirror in order to control the direction of the laser beam. FSMs are well known to those having skill in the art, and need not be described further herein. Other types of beam steering mirrors are well known in the art, including scanning mirrors. A galvanometer based scanning mirror can be used in place of FSMs and are also well known to those having skill in the art. Fast steering beam mirrors 202 and 203 are connected by lines 207 and 208 to fast steering mirror controllers 206 and 213. Voice coils, or devices that are galvanometers or act like galvanometers, are used in fast steering mirrors to use the electrical signals it receives from the controllers. Fast steering mirror controllers 206 and 213 control the fine pointing and tracking of the laser beams.

Fast steering mirror 202 is coupled to the quad cell detector 210 via the controller 206. Quad cell detector 210 is located outside the chamber wall 209 of the charged particle beam system 201. Chamber wall 209 separates the vacuum chamber of the charged particle beam system 201 from the outside. As laser beam 204 reflects off of fast steering mirror 202 and 203, laser beam 204 is split with a beam sampler, or beam splitter 211, to form a second beam 223. Beam splitter 211 is a conventional beam splitter that separates the beam into two component beams. The power splitting between the two component beams is determined by the reflection and transmission coefficients of the beam splitter. Second beam 223 is directed to quad cell detector 210. Generally, second beam 223 is the weaker beam of the two split beams. Quad cell detector 210 and quad cell detector 215 can be conventional alignment detectors that are capable of detecting the alignment, or the position, of a laser beam source. A position sensitive detector (PSD) is another type of an alignment detector. A PSD can be generally a photoelectric device that converts an incident light, or laser beam, into continuous position data. In other words, a PSD can detect and record the position of incident light beams. A PSD can have various configurations, including a quadrant detector configuration or a dual axis lateral effect detectors. The purpose of these two types is to sense the position of the beam centroid in the X-Y plane orthogonal to the optical axis. In order to measure the X and Y position from the PSD, four electrodes are attached (not shown) to the detector and an algorithm then processes the four currents generated by photoabsorption. Quad cell detector 210 is generally fixed and provides the positional data of laser beam 204 to FSM controller 206. It then makes the adjustments in the fast steering mirror 202 so that the laser beam comes to an alignment point 220. Laser beam 204 enters the vacuum chamber via window 212 where the laser beam is focused using objective lens 214.

Quad cell detector 215 is coupled to controller 213 and fast steering mirror 203. Quad cell detector 215 is located inside the chamber wall 209 within the vacuum chamber. Quad cell detector 215 works with the fast steering mirror controller 213 and fast steering mirror 203 to mechanically align the laser beam 204 to an alignment point 221. The in-chamber quad cell detector 215 is able to be positioned remotely with relatively good positional accuracy and high repeatability. Other types of alignment detectors can perform the detection of the laser alignment or position detection. A quad cell detector is generally a uniform disk with two gaps across its surface. It generates four signals from each quadrant of the disk. The laser beam is varied on the disk until the signal strength of each quadrant of the disk is equal. The in-chamber quad cell detector 215 is capable of being retracted or moved to clear the path for laser beam 204 with retractor 222. Retractor 222 can be controlled remotely from outside the vacuum chamber 360 and can be any mechanism that can move the quad cell detector 215 from its alignment position to a position away from laser beam pathway. The mechanism can be a lever that is manually adjusted in the X-Y-Z direction, or the mechanism can be an electronic component that can electronically adjust the quad cell detector 215 in the X-Y-Z direction. The mechanism must allow the retractor 222 to move the quad cell detector 215 in and out of the proper position accurately and repeatedly. The retractor 222 is aligned to the optical axis of the objective lens 214. In one embodiment of the invention, the objective lens 214 provides a hard stop for the quad cell detector 215 (not shown). It would include an electronically controlled actuator arm that slides the quad cell detector 215 in and out of the proper aligned position.

Figure 3:
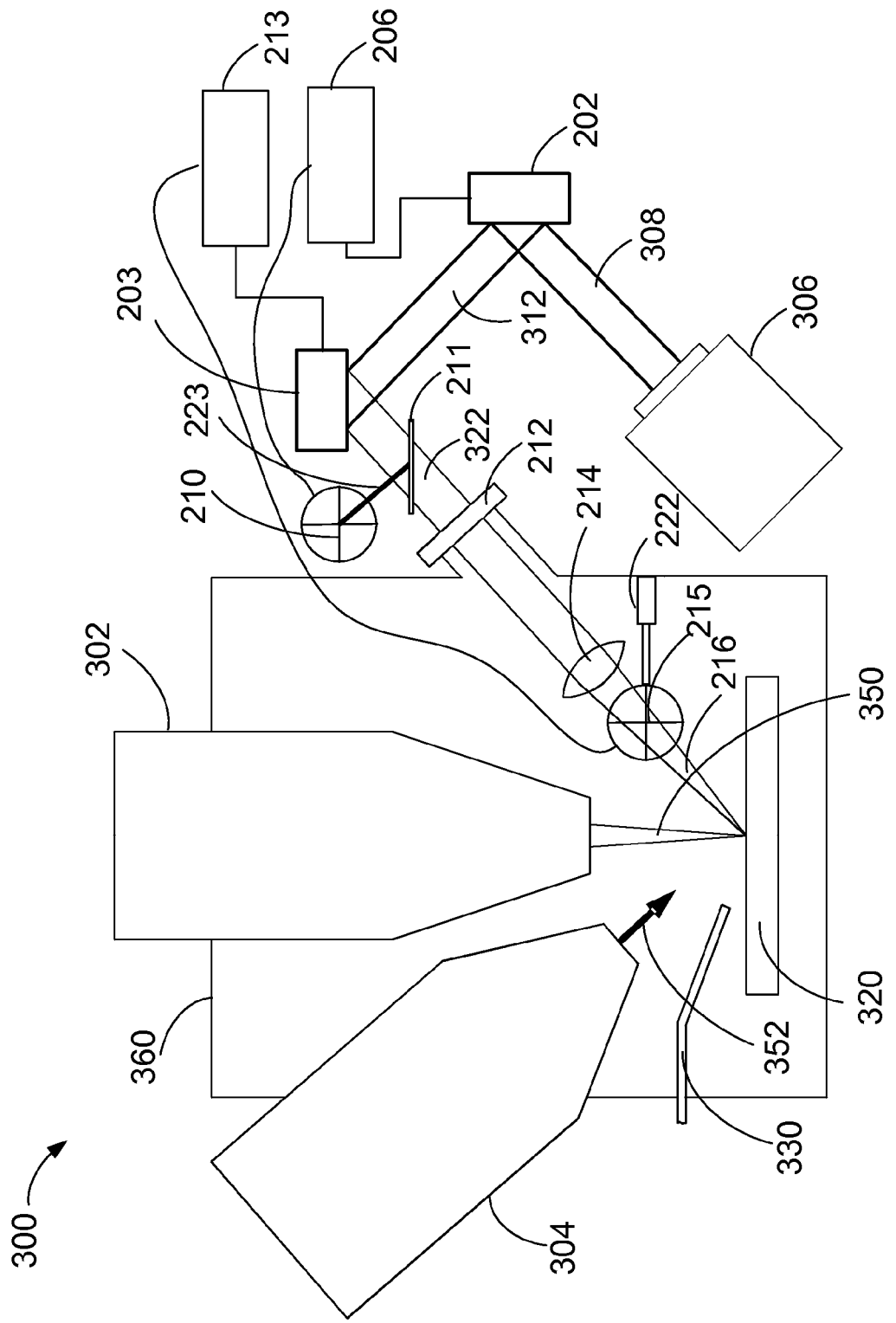
FIG. 3 shows a schematic view of an embodiment of the invention showing a laser beam alignment system integrated with a multi-beam system.

FIG. 3 shows a system 300 according to a preferred embodiment of the present invention that combines a focused laser beam 216 (produced by a laser 306) for rapid material removal with a focused ion beam (FIB) 352 (produced by a FIB column 304) for further material processing and an electron beam 350 (produced by a SEM column 302) for monitoring the material removal process. A laser 306 directs a laser beam 308 towards a first steering mirror 202, which reflects the laser beam 308 to form a first reflected beam 312. First reflected beam 312 is directed towards a second steering mirror 203, which reflects the first reflected beam 312 to form a second reflected beam 322 which is directed through transparent window 212 in vacuum chamber 360. By "transparent" it is meant that the window is transparent to wavelengths of the particular type of laser being used. Steering mirrors 202 and 203 (or a similar reflecting elements) are used to adjust the position of the laser beam 216 on the sample 320.

An objective lens 214 focuses the laser beam 322 (which may be substantially parallel) into a focused laser beam 216 with a focal point at or near to the surface of a sample 320. In some embodiments, laser beam 216 is preferably capable of being operated at a fluence greater than the ablation threshold of the material in sample 320 being machined. Preferred embodiments of the invention could use any type of laser, now existing or to be developed, that supplies sufficient fluence. A preferred laser provides a short, nanosecond to femtosecond, pulsed laser beam. Suitable lasers include, for example, a Ti:Sapphire oscillator or amplifier, a fiber-based laser, or an ytterbium- or chromium-doped thin disk laser. Other embodiments may use a laser having less fluence that reacts with the workpiece without ablation, such as thermally induced chemical desorption processes using a laser or the process of laser photochemistry. The current system allows for the manipulation of the fast steering mirrors 202 and 203 to be precisely controlled with the adjustments calculated by the reading of the quad cell detectors 210 and 215 so that the alignment of the laser beam can be made through the center of the objective lens 214 and ultimately, targeting the eucentric point of the target 320. Quad cell detector 214 is located as close to the output of the objective lens 214 as practically possible to provide better precision of the laser beam and to prevent damage to the detector induced by the focused laser beam.

Sample 320 is typically positioned on a precision stage (not shown), which preferably can translate the sample in the X-Y plane, and more preferably can also translate the work piece in the Z-axis, as well as being able to tilt and rotate the sample for maximum flexibility in fabricating three-dimensional structures. System 300 optionally includes one or more charged particle beam columns, such as an electron beam column 302, an ion beam column 304, or both, which can be used for imaging the sample to monitor the laser ablation process, or for other processing (such as FIB-milling) or imaging tasks. Ion beam column 304 typically forms a beam of ions 352 which may be focused onto the sample surface 320 at or near the focal point of the laser beam 318. FIB column 304 may also be capable of scanning ion beam 352 on the substrate surface to perform imaging and/or FIB milling. System 300 may also include a gas injection 330 system for supplying a precursor gas that reacts with the substrate 320 in the presence of the electron beam 350 or focused ion beam 352.

As is well-known in the prior art, the electron beam column 302 comprises an electron source (not shown) for producing electrons and electron-optical lenses (not shown) for forming a finely focused beam of electrons 350 which may be used for SEM imaging of the sample surface 320. The beam of electrons 350 can be positioned on, and can be scanned over, the surface of the sample 320 by means of a deflection coil or plates (not shown). Operation of the lenses and deflection coils is controlled by power supply and control unit (not shown). It is noted that the lenses and deflection unit may manipulate the electron beam through the use of electric fields, magnetic fields, or a combination thereof.

Sample chamber 360 preferably includes one or more gas outlets for evacuating the sample chamber using a high vacuum and mechanical pumping system under the control of a vacuum controller (not shown). Sample chamber 360 also preferably includes one or more gas inlets through which gas can be introduced to the chamber at a desired pressure.

Figure 4:
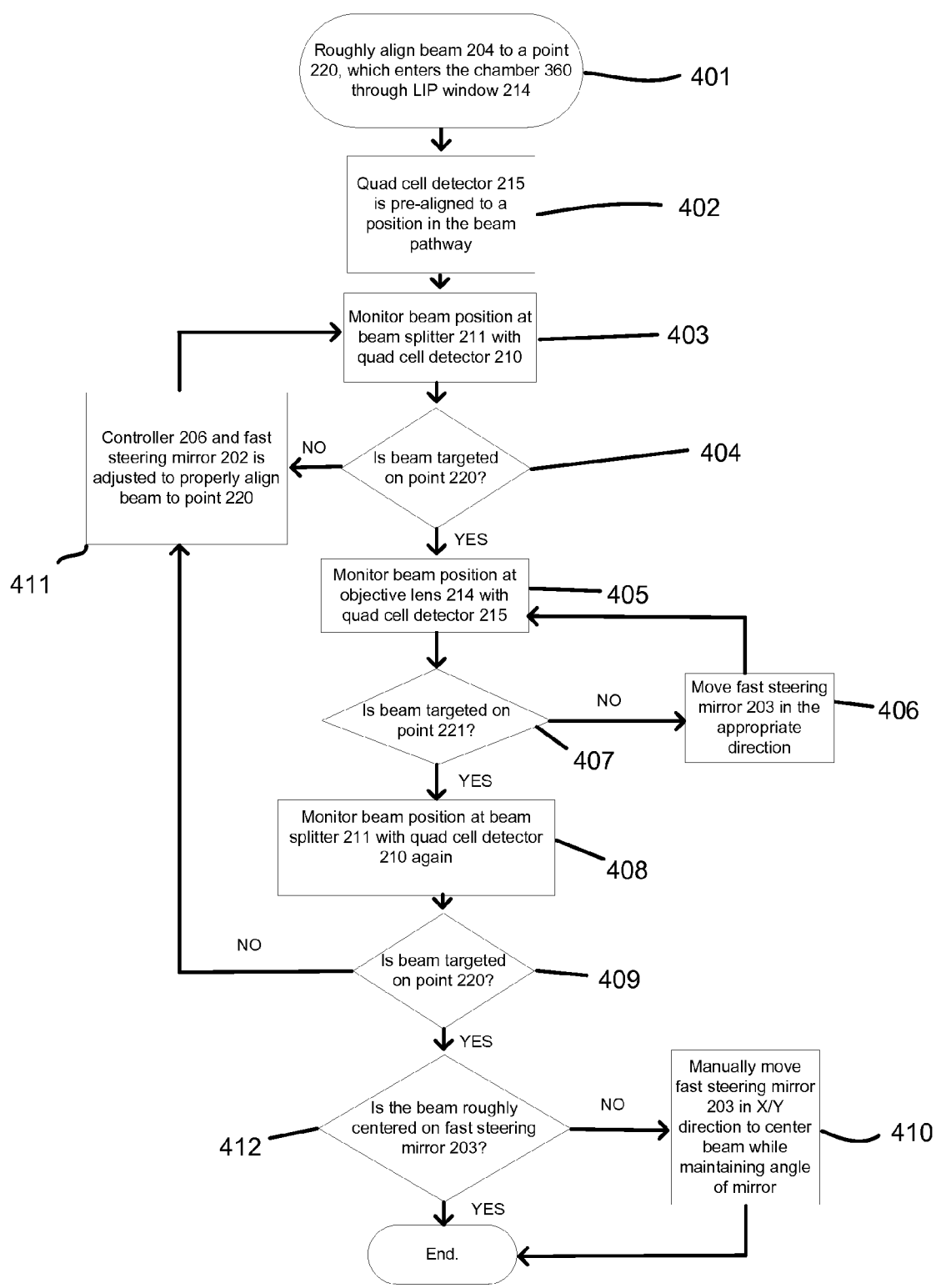
FIG. 4 is a flowchart showing the steps of a laser beam alignment process.

FIG. 4 is a flowchart showing the steps of an algorithm for the alignment of the laser beam system 300 of FIG. 3 in accordance with one of the embodiments. Before the algorithm is begun, in step 401, the beam must be coarsely focused and aligned so that the laser beam is aligned to point 220. This step should be done with the system vented and the isolation table, if any, floated. Laser beam 204 is further positioned so that it passes through the laser injection port (LIP) window 214 and into the vacuum chamber 360. Adequate coarse focus will generally result in the formation of visible plasma when the vacuum chamber is open. The optical emission from the plasma will enable the user to roughly position the focus of the laser beam close to the eucentric point of the column (the LIP window 214 is capable of being manually translated in X, Y, and Z from outside the chamber). The LIP window 214 can be shifted in the X and Y directions, which positions the beam on the sample. The LIP window 214 can be moved in and out in the Z axis so that that focus of the beam can be directed to a desired location, e.g., so that the beam is aligned with the eucentric point of the system. After the manual coarse focus and positioning of the beam, the system 300 is pumped down and the electron beam turned on. Generally, the manual manipulation for coarse focusing will only need to be done the first time the laser is aligned with system 300.

In step 402, quad cell 215 is moved to its pre-aligned position in the laser beam pathway. In step 403, the position of the laser beam 204 on the beam splitter 211 is monitored at quad cell detector 210. Beam position information from quad cell detector 210 is converted to a usable signal (via the fast steering mirror 202 and controller 206). In steps 404 and 411, controller 206 works with the voice coils of fast steering mirror 202, which provides the precision adjustments needed to steer the beam to be coincident with point 220. Steps 404 and 411 are performed repeatedly until the beam is aligned properly to point 220.

Once the beam is aligned properly to point 220, in step 405, the position of the beam at the objective lens 214 is monitored by quad cell detector 215. As with quad cell detector 210, beam position information from quad cell detector 215 is converted to a voltage (via the fast steering mirror 203 and controller 213) that is applied to the voice coils of fast steering mirror 203. The adjustments made to fast steering mirror 203 with controller 213 is repeatedly, sequentially, and iteratively made until the beam is coincident with point 221 in step 407. If the beam is targeted properly on point 221, in step 408, the beam position is once again monitored at beam splitter 211 with quad cell detector 210. In step 409, the beam is monitored to be targeted on point 220. The whole process is repeated until the beam is aligned with both points 220 and 221.

Once alignment of beam is made to be coincident with points 220 and 221, the beam enters LIP window 212. The location of the beam is checked on fast steering mirror 203. It is necessary to use fast steering mirror 203 to direct the beam so that it is centered on sample 320 because the fast steering mirror 203 is used to scan the beam on sample 320. If the beam is not centered on the fast steering mirror 203, the scan may not be linear across the scan field. Not having it centered may also limit the extent of the scan in one direction. In cases where fast steering mirror 203 is not centered on sample 320, the entire mirror assembly is moved in the X/Y directions in step 410 as needed to center the beam. In this process, the angle of the mirror is generally not changed.

Once the laser beam is aligned to be coincident with the system's eucentric point, a retractor 222 is used to move quad cell detector 215 out of the beam path to allow the beam to be incident with the sample. In use, the laser beam is focused to the eucentric point of the charged particle system. The eucentric point is typically a prior known distance from the end of the electron column 302. The focus of electron beam 350 is adjusted such that the focus distance is the same as the eucentric point of the system and the workpiece height is adjusted until the sample comes into focus. A laser spot is then machined on the sample and compared to the system's eucentric point. If the laser spot is not positioned at the eucentric point, the LIP window 212 is manually adjusted until the correct position is achieved. The alignment procedure detailed above is repeated and the manual positioning of the laser spot is performed again. The whole process is iterated until the beam is aligned and positioned at the eucentric point and the electron beam 350 is aligned to the eucentric point. Once the alignment is set, LIP window 212 position is fixed.

The invention described above has broad applicability and can provide many benefits as described and shown in the examples above. The embodiments will vary greatly depending upon the specific application, and not every embodiment will provide all of the benefits and meet all of the objectives that are achievable by the invention. For example, in a preferred embodiment TEM samples are created using a gallium liquid metal ion source to produce a beam of gallium ions focused to a sub-micrometer spot. Such focused ion beam systems are commercially available, for example, from FEI Company, the assignee of the present application. However, even though much of the previous description is directed toward the use of FIB milling, the milling beam used to process the desired TEM samples could comprise, for example, an electron beam, a laser beam, or a focused or shaped ion beam, for example, from a liquid metal ion source or a plasma ion source, or any other charged particle beam. Further, although much of the previous description is directed at semiconductor wafers, the invention could be applied to any suitable substrate or surface.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A multi-beam system, comprising:
a vacuum chamber;
a workpiece support for supporting a workpiece within the vacuum chamber;
a charged particle beam system for generating a beam of charged particles, said beam directed toward the workpiece;
a laser beam system for generating a laser beam for processing the workpiece in the vacuum chamber;
a focused ion beam system for generating a focused ion beam;
an electron beam system for monitoring the material removal process;
an objective lens;
a laser beam alignment system that allows for the laser beam to be made through the center of the objective lens to target a eucentric point of the workpiece.

2. The multi-beam system of claim 1 in which the laser beam is operated at a fluence greater than an ablation threshold of the workpiece.

3. The multi-beam system of claim 2 in which the laser beam is a short, nanosecond to femtosecond, pulsed laser beam.

4. The multi-beam system of claim 1 in which the laser beam is operated at a fluence that reacts with the workpiece without ablation.

5. The multi-beam system of claim 4 in which the laser beam is a thermally induced chemical desorption process.

6. The multi-beam system of claim 4 in which the laser beam involves laser photochemistry.

7. The multi-beam system of claim 1 having at least one quad cell detector.

8. The multi-beam system of claim 7 wherein the at least one quad cell detector is located as close to the output of the objective lens to provide precision of the laser beam and to prevent damage to the detector induced by the focused laser beam.

9. The multi-beam system of claim 7 wherein the laser beam goes through an objective lens and wherein the laser beam is eucentric to the target.

10. The multi-beam system of claim 1 including a first beam steering controller which responds to a position signal detected by a first beam alignment detector and directs the first steering mirror to move a beam toward a first position;

and a second beam steering controller which responds to a position signal detected by a second beam alignment detector and directs the second steering mirror to move the beam toward a second position.

11. The multi-beam system of claim 10 wherein the first position and the second position are eucentric to the sample.

12. The multi-beam system of claim 1 wherein the laser beam goes through an objective lens and wherein the laser beam is eucentric to the target.

13. A method for laser alignment within a charged particle beam system, comprising:

coarsely focusing and aligning a laser beam at a workpiece;

positioning the laser beam so that it passes through a laser injection port window and into a vacuum chamber;

moving a quad cell detector to a pre-aligned position in the laser beam pathway, positioning the laser beam so that it is pointed on a first point of a beam splitter;

monitoring the position of the beam on the objective lens with the quad cell detector;

using a fast steering mirror to adjust the laser beam so that the laser beam is pointed to a second point aligned with the workpiece; and monitoring the position of the laser beam again on the objective lens so that it is pointed to said first point.

14. A method for laser alignment of claim 13 wherein beam position on the first point is made from converted voltages that is are applied to voice coils of the fast steering mirror.

15. A method for laser alignment of claim 13 wherein the process of targeting the laser beam on the first point and the second point is done repeatedly until the laser beam is aligned to both the first point and the second point.

16. A method for laser alignment of claim 13 wherein the fast steering mirror is used to scan the beam on the sample.

17. A method for laser alignment of claim 13 wherein if the steering mirror is not centered on the second point, the steering mirror is moved in the X/Y directed to center the beam.

18. A method for laser alignment of claim 13 wherein a laser spot is machined on the workpiece and compared to the system's eucentric point.

19. A method of using a laser system of claim 18 wherein if the laser spot does not match with the eucentric point, repeating the procedure until they match.

* * * * *